(12) United States Patent
Pommer et al.

(10) Patent No.: US 6,242,078 B1
(45) Date of Patent: Jun. 5, 2001

(54) HIGH DENSITY PRINTED CIRCUIT SUBSTRATE AND METHOD OF FABRICATION

(75) Inventors: Richard J. Pommer, Trabuco Canyon, CA (US); Jeffrey T. Gotro, Onalaska, WI (US); Nancy M. W. Androff, La Crosse, WI (US); Marc D. Hein; Corey J. Zarecki, both of Onalaska, WI (US)

(73) Assignee: Isola Laminate Systems Corp., LaCrosse, WI (US)

( * ) Notice: Subject to any disclaimer, the term of this patent is extended or adjusted under 35 U.S.C. 154(b) by 0 days.

(21) Appl. No.: 09/123,952

(22) Filed: Jul. 28, 1998

(51) Int. Cl.[7] .................................................... B32B 3/00
(52) U.S. Cl. ......................... 428/209; 174/250; 174/255; 428/901
(58) Field of Search ................................. 428/209, 210, 428/901; 174/250, 255

(56) References Cited

U.S. PATENT DOCUMENTS

| | | | |
|---|---|---|---|
| 3,632,435 | * 1/1972 | Eriksson et al. | 427/306 |
| 4,288,282 | * 9/1981 | Brown et al. | 428/209 |
| 4,705,592 | 11/1987 | Bahrle et al. | 156/630 |
| 4,707,565 | * 11/1987 | Kasai et al. | 174/68.5 |
| 4,777,201 | 10/1988 | Shigemoto et al. | 524/269 |
| 4,863,808 | 9/1989 | Sallo | 428/607 |
| 4,869,930 | 9/1989 | Clarke | 427/252 |
| 5,158,827 | 10/1992 | Katagiri et al. | 428/332 |
| 5,217,796 | * 6/1993 | Kasai et al. | 428/229 |
| 5,248,852 | * 9/1993 | Kumagai | 174/250 |
| 5,288,541 | 2/1994 | Blackwell et al. | 428/209 |
| 5,368,921 | * 11/1994 | Ishii et al. | 428/901 |
| 5,523,714 | * 6/1996 | Tamaki | 427/436 |
| 5,525,369 | 6/1996 | Blackwell et al. | 427/171 |
| 5,622,769 | 4/1997 | Kozuka et al. | 478/209 |
| 5,622,789 | 4/1997 | Young | 429/7 |
| 5,766,386 | * 6/1998 | Sakai et al. | 156/62.2 |
| 5,897,761 | * 4/1999 | Tagusari et al. | 205/77 |
| 6,063,481 | * 5/2000 | Arrington et al. | 428/209 |

FOREIGN PATENT DOCUMENTS

| | | |
|---|---|---|
| 0 472 177 A2 | 2/1992 | (EP) . |
| 0 520 236 A2 | 12/1992 | (EP) . |
| 0 298 345 B1 | 1/1993 | (EP) . |

* cited by examiner

Primary Examiner—Cathy Lam
(74) Attorney, Agent, or Firm—McDonnell Boehnen Hulbert & Berghoff

(57) ABSTRACT

The present invention is a method and apparatus for providing an electrical substrate. The electrical substrate comprises a dielectric layer having a surface roughness of no greater than 6.0 microns. A first conductive layer is attached to the dielectric layer. In one embodiment, the dielectric layer comprises a laminate that comprises a cloth having a uniform weave and a resin that is consistently impregnated within the uniform weave. A removable layer may be attached to the laminate and removed prior to metallizing of the first conductive layer. Various embodiments are described.

19 Claims, 11 Drawing Sheets

HIGH DENSITY PRINTED CIRCUIT SUBSTRATE AND METHOD OF FABRICATION

BACKGROUND OF THE INVENTION

1. Field of the Invention

The present invention relates in general to printed circuit boards, and more particularly to a method and apparatus of providing a high density printed circuit substrate.

2. Description of the Related Art

Integrated circuits are typically assembled into a package that is soldered to a printed circuit board. The integrated circuit may be mounted to a substrate which has a plurality of contacts such as solder balls or pins that are soldered to the printed circuit board. The contacts are typically located on a bottom surface of the substrate while the integrated circuit is typically located on a top surface of the substrate. The package substrate may contain routing traces, power/ground planes and vias that electrically connect the integrated circuit with the contacts located on the other side of the substrate. The substrate may have multiple layers of routing traces and vias to interconnect the integrated circuit and the contacts.

FIGS. 1A–E show a conventional process for forming a substrate. As shown in FIGS. 1A and 1B, a base laminate is first formed. In FIG. 1A, a conductive layer 2 such as copper is first electroplated onto a drum 4. The surface 6 of the conductive material 2 that is adjacent to the drum 4 is typically smooth, while the surface 8 of the conductive layer 2 that is on the opposite side of the drum 4 is typically matted. In addition, the matted surface 8 of the conductive layer 2 is typically treated by adding nodules or pinning teeth to the surface 8 so as to enhance the bond strength of the conductive layer 2 to a dielectric (see FIG. 1B) during the lamination process. The surface roughness $\mu$ of surface 8 is typically greater than 6.0 microns (peak-to-valley, $R_ZDIN$) as measured with a contact profilometer. A silane coupling promoter 10 is subsequently attached to the matted surface 8 to further enhance the bond strength of the conductive layer 2. As shown in FIG. 1B, the treated conductive layer 2 is then laminated onto one or both sides of a dielectric layer 12 under heat and pressure (only one layer 2 is shown as being attached to the dielectric layer 12 in FIG. 1B) to form a base laminate 14. An etch resist mask 16 may be patterned onto the base laminate 14 as shown in FIG. 1C. The resist mask 16 is then patterned, as shown in FIG. 1D, and the conductive layer 2 is subsequently etched to provide a substrate 18 as shown in FIG. 1E. The conductive layer 2 is typically 5–18 $\mu$m thick. The etch resist is subsequently removed to provide the circuitized substrate as shown in FIG. 1F.

During such conventional production of printed circuit substrates, residual metal inclusions (such as copper inclusions) are typically formed because slivers of the nodules break away from the matted surface 8 of the conductive layer 2 during the lamination process. Since the etching process typically fails to remove these deeply embedded slivers, the imperfections remaining in the laminate 14 act as seed sites for electroless plating, and subsequently cause conductive defects on the laminate 14 surface. These defects result in potential shorts in the circuitry produced by the customer.

With design goals of providing increasingly higher density printed circuit boards, the trace line and space features of printed circuit boards are proportionally decreased. In addition, the diameters of pads that capture vias on the circuit boards need to be reduced. As the trace lines and space features become finer (e.g., 10–50 $\mu$m), the problem of embedded slivers become more pronounced. Moreover, to etch fine lines and spaces, the conductive layer 2 (e.g., a copper layer) needs to be much thinner.

In addition, during conventional production of printed circuit boards, the substrate is typically subjected to various pressure and temperature cycles. One typical method for fabricating laminates employs a flat-bed lamination press using hydraulic pressure. Electrodeposited copper foils are laminated to thermosetting resin-cloth prepregs under heat and pressure. The resultant laminate typically has unacceptable levels of residual stresses, primarily arising from the mechanical interaction of the treated copper tooth structure and the crosslinked laminate surface. Subsequently, during etching of the first conductive layer 2 (e.g., the copper layer), the built-in stress causes very large and unpredictable dimensional movements, requiring the use of increased capture pad diameters.

Accordingly, there is a need in the technology for an apparatus and method for providing a high density printed circuit substrate with reduced conductive defects. There is also a need in the technology for an apparatus and method for providing a high density printed circuit substrate having improved dimensional consistency, so that fine line formation may be achieved, and pad size dimensions may be decreased. In addition, there is a need in the technology for providing a circuit substrate having a reduced copper thickness. There is a further need in the technology for a substrate with very smooth surfaces, which facilitates the production of printed circuit substrates having very fine lines and spaces, with significantly reduced occurrence of defects.

BRIEF SUMMARY OF THE INVENTION

The present invention is a method and apparatus for providing an electrical substrate. The electrical substrate comprises a dielectric layer having a surface roughness of no greater than 6.0 microns. A first conductive layer is attached to the dielectric layer. In one embodiment, the dielectric layer comprises a laminate that comprises a cloth having a uniform weave and a resin that is consistently impregnated within the uniform weave. A removable layer may be attached to the laminate and removed prior to metallizing of the first conductive layer. Various embodiments are described.

DETAILED DESCRIPTION OF THE INVENTION

One aspect of the present invention relates to a method and apparatus for providing an electrical substrate. The electrical substrate comprises a dielectric layer having a surface roughness of no greater than 6.0 microns. A conductive layer such as copper is attached to the dielectric layer. In an alternate embodiment, an adhesion layer is first attached to the dielectric layer. Subsequently, a conductive layer is deposited over the adhesion layer.

Another aspect of the present invention relates to a method and apparatus for providing the dielectric layer, which comprises a balanced cloth (i.e., a cloth having a uniform weave) that is impregnated with a resin that is cured with an agent that does not contain dicyandiamide (DICY). It is understood that the term "impregnation" as used herein includes solution casting, extrusion or spinning of the resin into the cloth. The term "impregnation" also includes other generally known techniques for impregnating the resin into the cloth. The resin has a glass transition temperature (Tg) of greater than 180° C., and a dielectric constant in the range of 2.9–3.1. The resin-impregnated cloth is partially cured (b-staged) to form a prepreg. Subsequently, multiple plies of prepreg are laminated using heat and pressure to produce a laminate. The resulting laminate is stable, stress-relieved, has a controlled coefficient of thermal expansion (CTE) that is closely matched to the conductive layer (e.g., copper), has a reduced dissipation factor in the range of 0.008–0.015, a low moisture content in the range of 0.4–0.6% by weight; and a low dielectric constant in the range of 3.2–3.7. Various embodiments are described.

Figure 2:
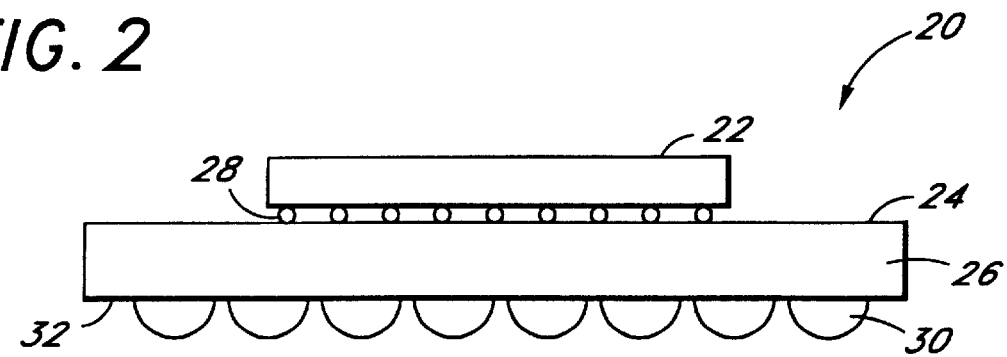
FIG. 2 illustrates one embodiment of an integrated circuit package 20 provided in accordance with the principles of the present invention.

FIG. 2 illustrates one embodiment of an integrated circuit package 20 provided in accordance with the principles of the present invention. The package 20 may include an integrated circuit 22 that is mounted to a first surface 24 of a substrate 26. The integrated circuit 22 may be mounted to the substrate 26 with a plurality of solder bumps 28. The attachment of the integrated circuit 22 to the substrate 26 may be performed with a process commonly referred to as the flip chip solder connection. Although a flip chip solder package is described herein, it is understood that the integrated circuit 22 may be attached to the substrate 26 with bond wires or tape automated bonding (TAB) or by other techniques as known in the technology.

A plurality of contacts 30 may be attached to a second surface 32 of the substrate 26. The contacts 30 may be solder balls that are reflowed onto the substrate 26. The contacts 30 may be subsequently attached to a printed circuit board (not shown). The substrate 26 may have surface pads, routing traces, power/ground planes and vias that interconnect the solder bumps 28 to the contacts 30. The substrate 26 may also have multiple layers of routing traces, power/ground planes and vias to interconnect the integrated circuit 22 to the contacts 30.

Figure 3A:
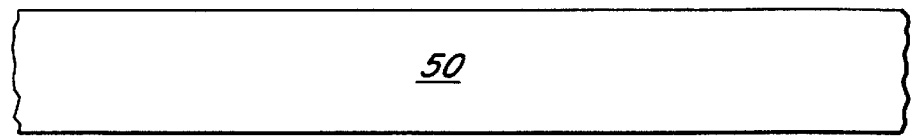
FIGS. 3A–H illustrate one embodiment of a process for forming a high density circuit substrate 26 in accordance with one embodiment of the present invention.
Figure 3B:
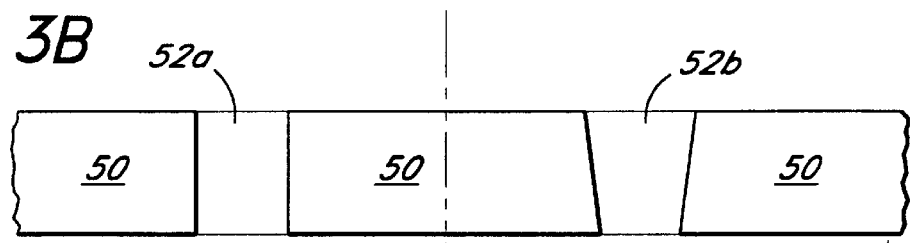
Figure 3C:
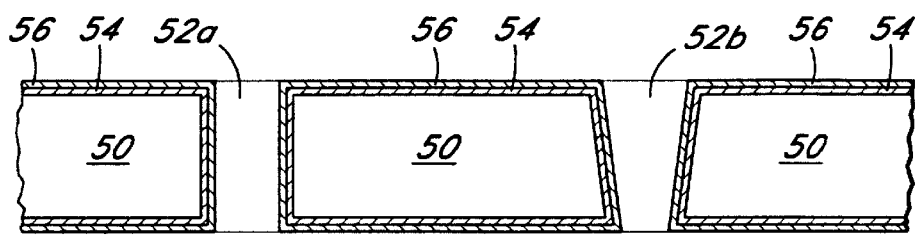

FIGS. 3A–H illustrate one embodiment of a process for forming a high density printed circuit substrate 26 in accordance with one embodiment of the present invention. The high density printed circuit substrate 26 comprises a base laminate 50, as shown in FIG. 3A. In one embodiment, the base laminate 50 is a dielectric layer that is provided in accordance with the principles of the present invention, and as discussed in detail in the following sections. A via opening 52a and/or 52b may be formed in the base laminate 50, as shown in FIG. 3B. Such a via opening 52a and/or 52b may be mechanically drilled (e.g., via opening 52a) or laser drilled (e.g., via opening 52b) in the base laminate 50. A typical diameter of a laser drilled hole is in the range of 10–100 μm, while a typical diameter of the mechanically drilled hole is approximately 0.004 inches/100 μm or larger. As shown in FIG. 3C, a first conductive layer 54 may be attached to the base laminate 50. In one embodiment, the first conductive layer 54 is an adhesion layer. Examples of such an adhesion layer includes chromium, titanium, tungsten, zinc and nickel. It is understood that other types of adhesives known in the art may also be used.

The first conductive layer 54 may be deposited in any manner generally known in the art, including various additive, semi-additive or subtractive techniques. Deposition of the first conductive layer 54 may be performed via processes such as vacuum metallization, sputtering, ion plating, chemical vapor deposition, electroplating, electroless plating, etc. In one embodiment, the first conductive layer 54 has a thickness in the range of 50–200 Angstroms. In another embodiment, the first conductive layer 54 may be simultaneously attached onto both surfaces of the base laminate 50. In an alternate embodiment, the first conductive layer 54 is simultaneously attached onto both surfaces of the base laminate 50 and into the via opening 52a and/or 52b.

Subsequently, a second conductive layer 56 is attached to the first conductive layer 54, as shown in FIG. 3C. As in the case of the first conductive layer 54, the second conductive layer 56 may be deposited in any manner generally know in the art, including various additives, semi-additive or subtractive techniques. Deposition of the first conductive layer 56 (and other conductive layers described herein) may be performed via processes such as vacuum metallization, sputtering, ion plating, chemical vapor deposition, electroplating, electroless plating, etc. The conductive layers 54 and 56 may be formed of single metal layers or composite layers formed by different processes, conductive polymers and the like. Examples of the second conductive layer 56 includes copper, gold, and aluminum. In one embodiment, the first conductive layer 56 is an adhesive layer and the second conductive layer is a seed layer. In another embodiment, the second conductive layer 56 is greater than 500 Angstroms. In a further embodiment, the thickness of second conductive layer 56 is in the range of 500–10,000 Angstroms. The second conductive layer 56 may be deposited on one or both sides of the base laminate 50. Alternatively, the second conductive layer 56 may be simultaneously attached (e.g., vacuum metallized or sputtered) onto both surfaces of the base laminate 50 and into the via opening 52a and/or 52b. In an alternative embodiment, a direct metallization process using an immersion Palladium catalyst, may be implemented to attach a single conductive layer such as copper (instead of two conductive layers, e.g., the first and second conductive layers 54 and 56), onto one or both surfaces of the base laminate 50. In this alternate metallization process, a first conductive layer 54 such as the adhesion layer (e.g., chromium, tungsten, titanium, nickel or zinc) is not required to facilitate bonding of the second conductive layer 56 (e.g., the seed layer) to the base laminate 50.

Figure 3D:
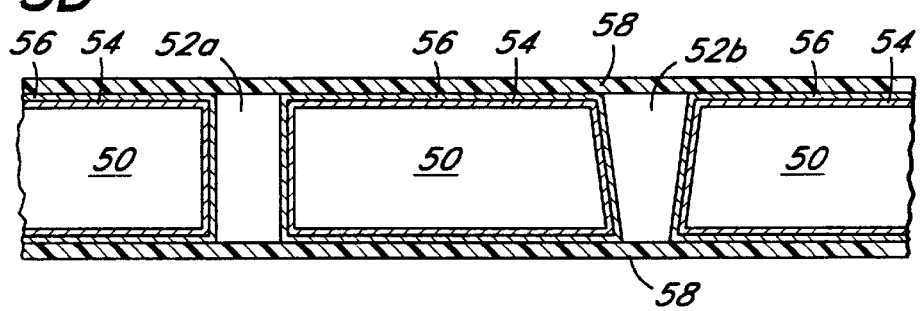
Figure 3E:
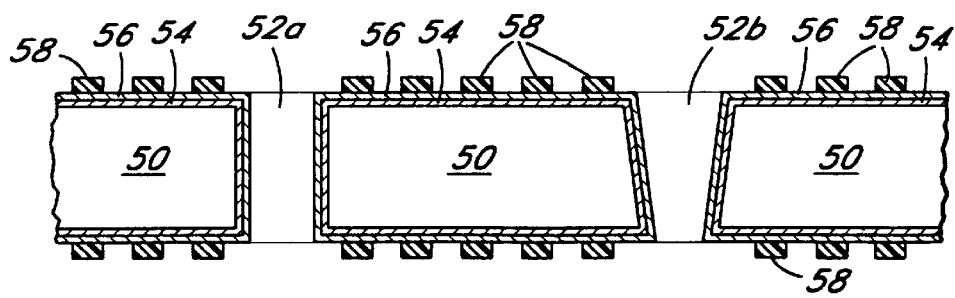

As shown in FIGS. 3D and 3E, a resist 58 such as a photoimageable dry film resist may be patterned onto the second conductive layer 56 (or to the single conductive layer that was attached to the base laminate 50 using the direct metallization process). The plating resist 56 can be patterned with conventional photolithographic techniques by applying a layer of resist and subsequently removing portions of the resist material, as shown in FIG. 3E. In one embodiment, the portions of the resist 56 may be masked and the excess portions of the resist 56 may be removed using appropriate developing solutions such as aqueous or solvent based developing solution.

Figures 1, 3F:
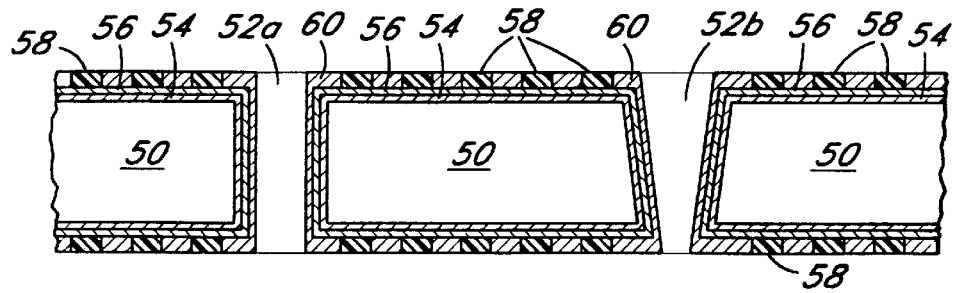
Figures 2, 3F:
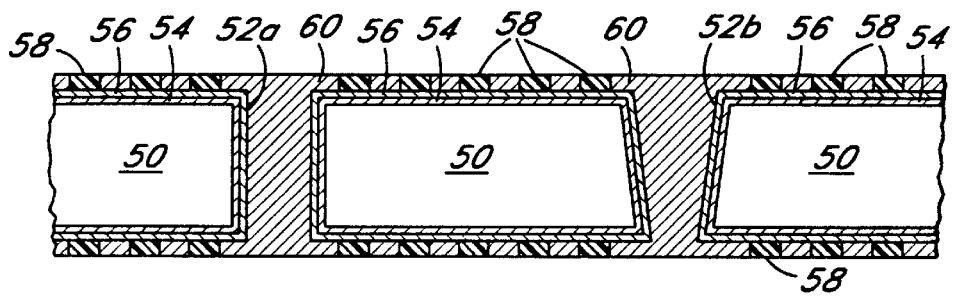

An additional layer of conductive material 60, for example, copper, may be deposited (e.g., electroplated) onto the areas of the second conductive layer 56 not covered by the resist 58, as shown in FIGS. 3F-1 and 3F-2, to facilitate fine line geometry circuits. In one embodiment, as shown in FIG. 3F-1, the via opening 52a and/or 52b can either be plated to a specified copper wall thickness (typically 0.001 inch), or completely plated closed, yielding a solid post for future joining processes, as shown in FIG. 3F-2. Typically, the smaller laser drilled holes are better candidates for plating the via openings completely closed.

Figure 3G:
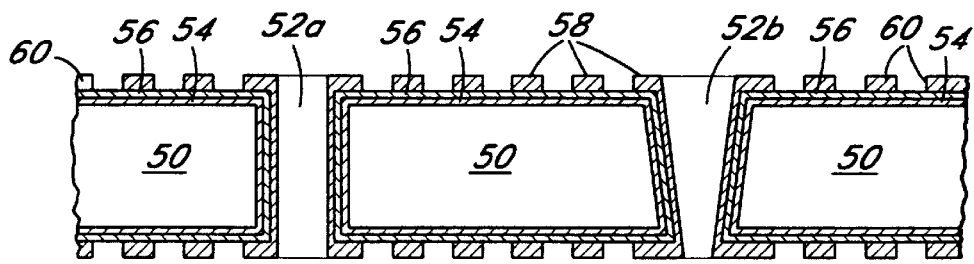
Figure 3H:
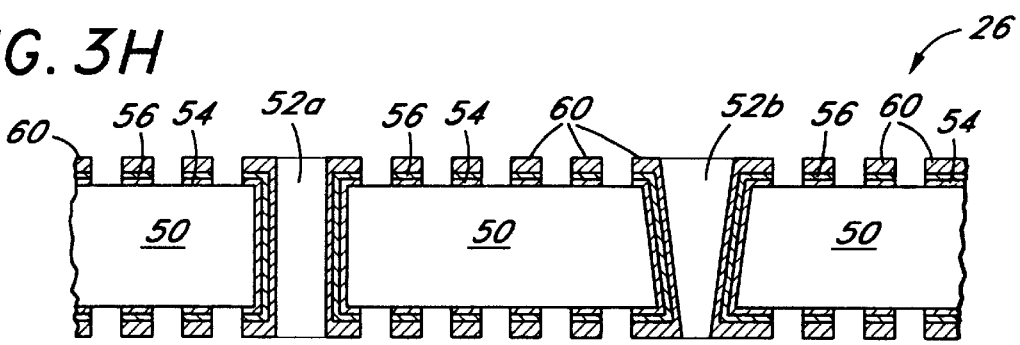

As shown in FIG. 3G, the resist 58 is then removed. Next, a flash etching process is implemented. The purpose of this is to remove the second conductive layer 56 (which for example, is the copper seed layer) or for removing the single conductive layer (which for example, is the copper seed layer). Subsequently, the substrate 26 is subject to an etch solution to remove the first conductive layer 54 (which, for example, is a chromium etch solution for removing the 50–200 Angstroms of chromium exposed after the copper is removed). Removal of the chromium ensures electrical insulation between the plated circuit traces. The circuitization process described above may be applied to one or both surfaces (for example, surface 24 and/or 32) of the substrate 26.

Figure 4A:
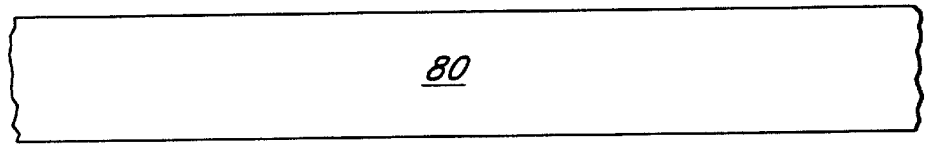
FIGS. 4A–I illustrate an alternate embodiment of a process for forming a high density circuit substrate 26a in accordance with one embodiment of the present invention.

FIGS. 4A-I illustrate an alternate embodiment of a process for forming the high density circuit substrate 26 in accordance with the principles of the present invention. The high density printed circuit substrate 26a may be used in place of the substrate 26 and comprises a base laminate 80, as shown in FIG. 4A. In one embodiment, the base laminate 80 is a dielectric layer that is provided in accordance with the principles of the present invention, and is discussed in detail in the following sections.

Figure 4B:
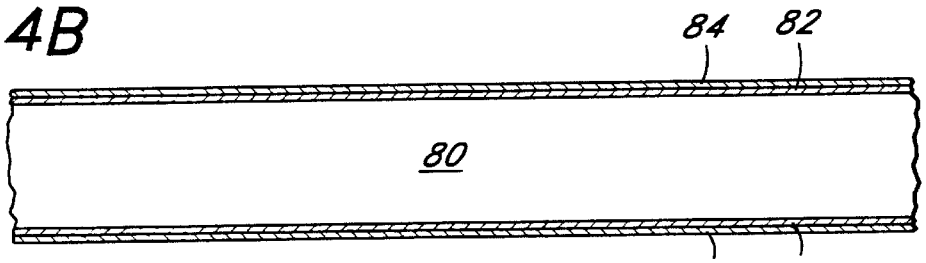

As shown in FIG. 4B, a first conductive layer 82 may be attached to the base laminate 80. In one embodiment, the first conductive layer 82 is an adhesion layer. Examples of such an adhesion layer include chromium, titanium, tungsten, zinc, and nickel. It is understood that other types of adhesives may also be used. The first conductive layer 82 may be deposited in any manner generally known in the art, including various additive or semi-additive or subtractive techniques. Deposition of the first conductive layer 82 (and other conductive layers described herein) may be performed via processes such as vacuum metallization, sputtering, ion plating, chemical vapor deposition, electroplating, electroless plating, etc. In one embodiment, the first conductive layer 82 has a thickness in the range of 50–200 Angstroms. In another embodiment, the first conductive layer 82 may be simultaneously attached onto both surfaces of the base laminate 80. Subsequently, a second conductive layer 84 is attached to the first conductive layer 82, as shown in FIG. 4B.

As in the case of the first conductive layer 82, the second conductive layer 84 is deposited in any manner generally known in the art, including various additive or semi-additive substrate techniques. Deposition of the second conductive layer 84 may be performed via processes such as vacuum metallization, sputtering, ion plating, chemical vapor deposition, electroplating, electroless plating, etc. The conductive layers 82 and 84 may be formed of single metal layers or composite layers formed by different processes, and may include metals as well as conductive polymers and the like. Examples of the second conductive layer 84 includes copper, gold and aluminum. In one embodiment, the first conductive layer 56 is an adhesive layer and the second conductive layer is a seed layer. In one embodiment, second conductive layer 84 is greater than 500 Angstroms. In a further embodiment, the thickness of second conductive layer 84 is in the range of 500–10,000 Angstroms.

The second conductive layer 84 may be deposited on one or both sides of the base laminate 80. In an alternative embodiment, a direct metallization process using an immersion Palladium catalyst, may be implemented to attach a single conductive layer such as copper instead of two conductive layers (e.g., the first and the second conductive layers 82 and 84), onto one or both surfaces of the base laminate 80. In this alternate metallization process, the first conductive layer 82 such as the adhesion layer, is not required for facilitating bonding of the second conductive layer 84 onto the base laminate 80. Next, (for example, after the attaching the adhesion and the copper layers or after the direct metallization process), up to 0.5 microns of copper are flash plated onto the surface of the base laminate 80, as shown in FIG. 4B.

Figure 4C:
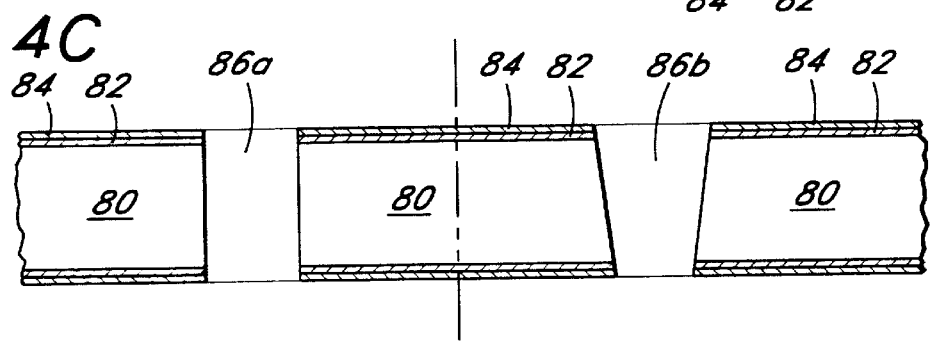

A via opening 86a and/or 86b may be formed in the base laminate 80, as shown in FIG. 4C. Such a via opening 86a and/or 86b may be mechanically drilled (e.g., via opening 86a) or laser drilled (e.g., via opening 86b) in the base laminate 80. A typical diameter of a laser drilled hole 86b is in the range of 10–100 μm inches, while a typical diameter of the mechanically drilled hole 86a is approximately 0.004 inches/100 μm or larger. Next, the via opening 86a and/or 86b are/is seeded. In one embodiment, a seeding layer 88 is attached along the walls of the via openings 86a and/or 86b. In an alternate embodiment, the seeding layer 88 is attached over the surface of the second conductive layer 84 (or the single conductive layer that is attached to the base laminate 80 using the direct metallization process) and also extends along the walls of the via openings 86a and/or 86b. In one embodiment, the seeding layer 88 may be any one of the following materials: palladium, tin or carbon.

Figure 4D:
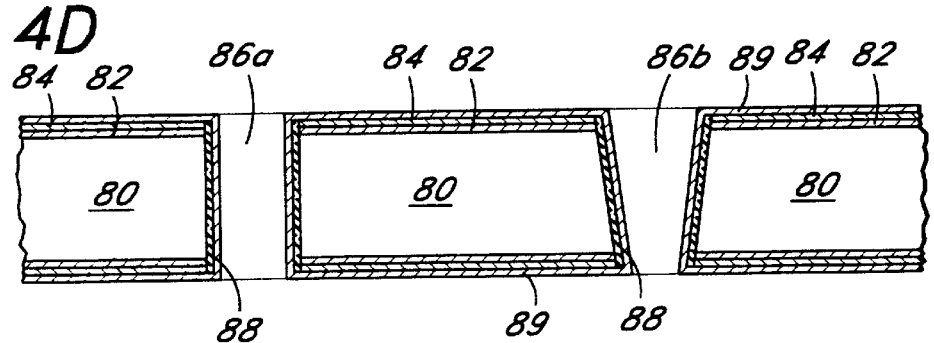
Figure 4E:
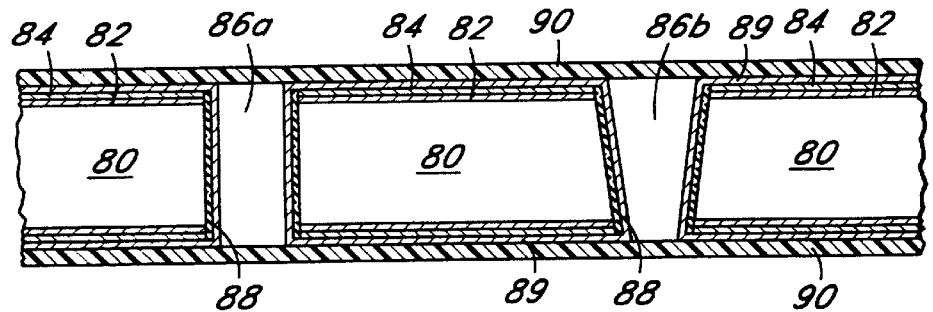
Figure 4F:
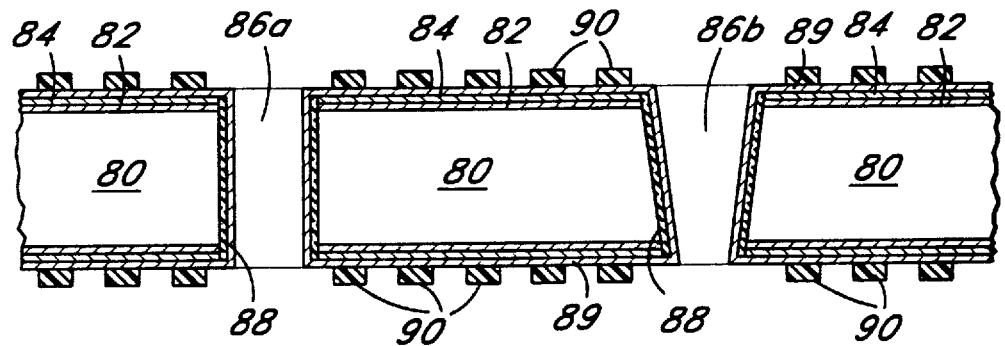

Subsequently, a third conductive layer 89 is deposited (e.g., electroless plated) into the via openings 86a and 86b and onto the layer 88, as shown in FIG. 4D. In one embodiment, the third conductive layer 89 is copper. In this embodiment, up to 1.0 microns of copper may be deposited (e.g., flash plated) over the third conductive layer 89 and into the via openings 86a and 86b. As shown in FIG. 4E, a resist 90 such as a photoimageable dry film resist may be patterned onto the third conductive layer 89. The plating resist 90 can be patterned with conventional photolithographic techniques by applying a layer of resist and subsequently removing portions of the resist material, as shown in FIG. 4F. In one embodiment, the portions of the resist 90 may be masked and the excess portions of the resist may be removed using appropriate developing solutions such as aqueous-based or solvent-based developing solutions.

Figures 1, 4G:
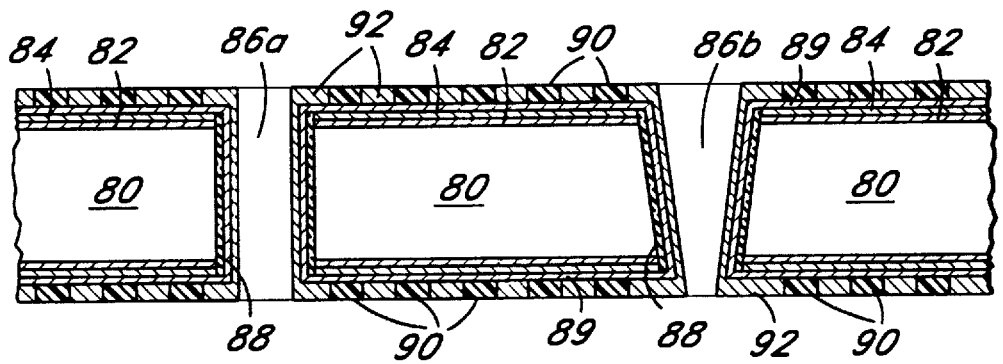
Figures 2, 4G:
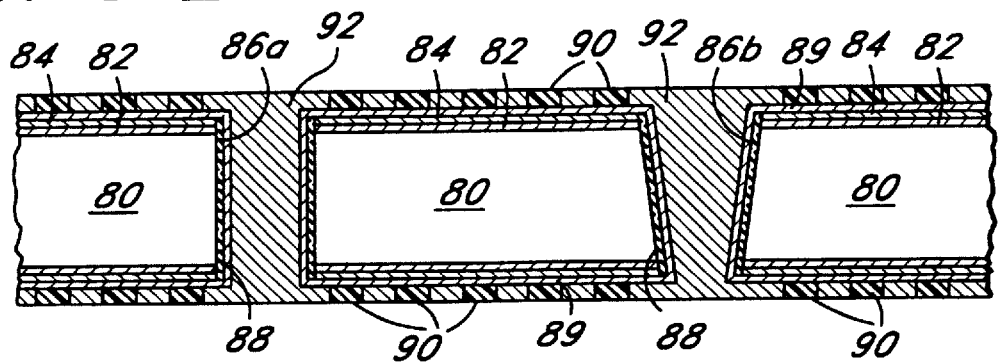

An additional layer of conductive material 92 such as copper material may be deposited (e.g., electroplated) onto the areas of the third conductive layer 89 not covered by the resist 90, as shown in FIGS. 4G-1 and 4G-2, to facilitate fine line geometry circuits. In one embodiment as shown in FIG. 4G-1, the via opening 86a and/or 86b can either be plated to a specified copper wall thickness (typically 0.001 inch), or completely plated closed, yielding a solid post for future joining processes, as shown in FIG. 4G-2. Typically, the smaller laser drilled holes are better candidates for plating the via openings completely closed.

Figure 4H:
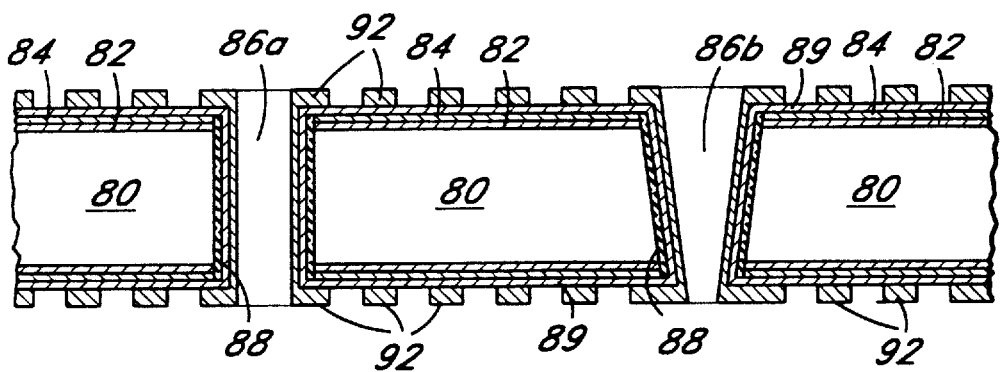
Figure 4I:
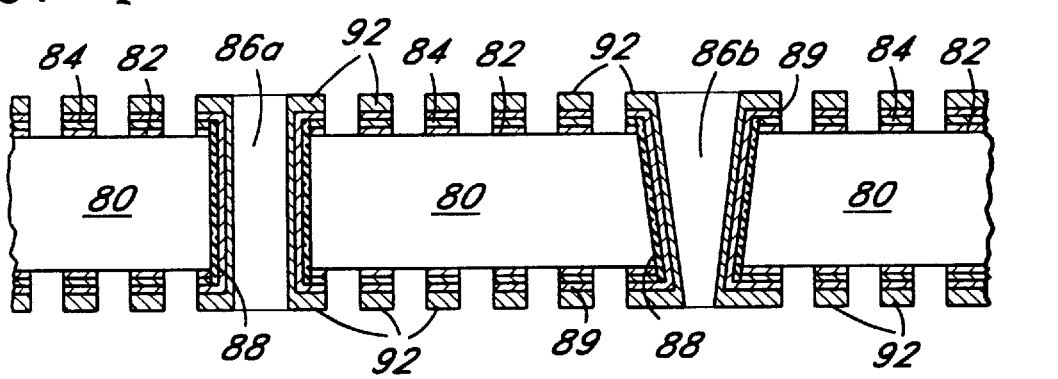

As shown in FIG. 4H, the resist 90 is then removed. Next, a flash etching process is implemented. The purpose of this is to remove the second and third conductive layers, 84 and 89 respectively (which, for example may be the copper material and copper seed layer respectively) or to remove the single conductive layer and the third conductive layer 89 (which, for example, may be the copper material and the copper seed layer respectively). Subsequently, the substrate 26a is subject to an etch solution for removing the first conductive layer 82 (which, for example, may be a chromium etch solution for removing the 50–200 Angstroms of chromium exposed after the copper is removed). Removal of the chromium ensures electrical insulation between the plated circuit traces. The circuitization process described above may be applied to one or both surfaces (for example, surface 24 and/or 32) of the substrate 26a.

Through the use of the build up process(es) as described above and as shown in FIGS. 3A–3H and FIGS. 4A–4I, the present invention provides a circuit substrate having reduced copper thickness. Accordingly, conventional techniques for providing circuit substrates, which includes lamination of electrodeposited copper foils to thermosetting resin-cloth prepregs under heat and pressure, may be avoided. Such conventional techniques typically provide copper layers that are 5–18 $\mu$m thick. However, using the technique(s) of the present invention, copper layers of less than 5 $\mu$m thick may be achieved. In alternate embodiments, copper layers of 1–3 $\mu$m may be achieved.

Figure 5A:
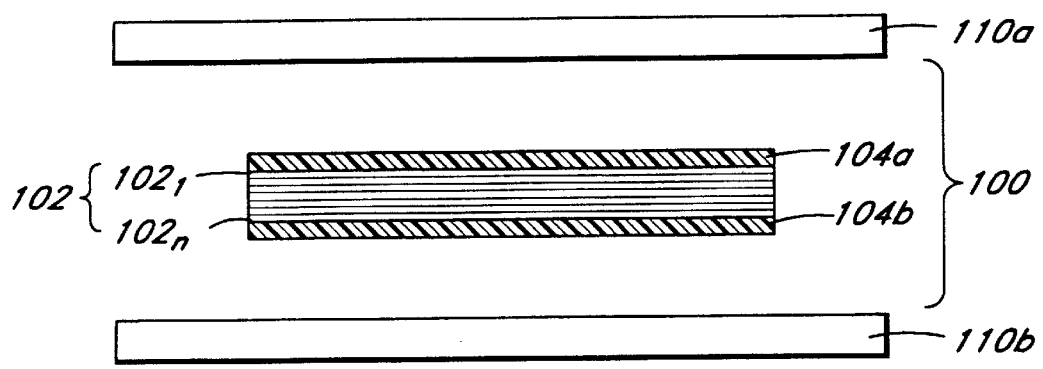
FIG. 5A illustrates a side view of one embodiment of a polymer-coated base laminate 100 provided in accordance with the principles of the present invention.

A second aspect of the present invention involves an apparatus and method for providing the base laminate 50 or 80. For present discussion purposes, either of the base laminates 50 or 80 will hereinafter be referred to as the base laminate 102. FIG. 5A illustrates a side view of one embodiment of a polymer-coated base laminate 100 provided in accordance with the principles of the invention. In one embodiment, the polymer-coated base laminate 100 comprises a base laminate 102 that includes at least one ply of a base laminate layer (for example, any one of $102-102_n$). Examples of the base laminate layer (e.g., any of $102_1-102_n$) include a pre-preg material (b-staged material). In an alternate embodiment, the polymer-coated base laminate 100 comprises a base laminate 102 that includes a plurality of base laminate layers $102_1-102_n$ which are selected and interleaved to form the base laminate 102. In one embodiment, the base laminate 102 is sandwiched between two removable layers or removable release films 104a and 104b. In one embodiment, the removable layer 104a or 104b is a removable polymer film. Examples of the polymer release film (e.g., 104a and/or 104b) include any one of: a polypropylene film, a polyimide film, a film constructed from fluorinated resins, polyetherimides, or a polyphenylene sulfide film. However, it is understood that other polymer release films known to one of ordinary skill in the art may be used.

In an alternate embodiment, the removable layer 104a and/or 104b may be a conductive layer or a conductive release sheet. The conductive layer may be a conductive metallic layer or a conductive non-metallic layer. Examples of the conductive metallic layer includes electrodeposited copper or aluminum, which has its shiny surface (or the surface adjacent to the drum during fabrication) pressed to the base laminate 102. The conductive layer (e.g., 104a and/or 104b) may also be fabricated from rolled copper or rolled aluminum, with the smooth surface of either material pressed against the base laminate 102. Examples of the non-metallic conductive layers include layers comprised of semiconductor material. The base laminate's 102 thickness and physical properties are controlled by the number and type of material used to fabricate the base laminate layers $102_1-102_n$. For example, a 0.004-inch base laminate 102 may comprise 2 plies of prepreg material (for example, $102_1$ and $102_2$), where each ply of prepreg layer (e.g., $102_1$ and $102_2$) comprises, for example, resin impregnated into a single ply of balanced cloth that is sandwiched between two removable layers or release films.

Figure 1A:
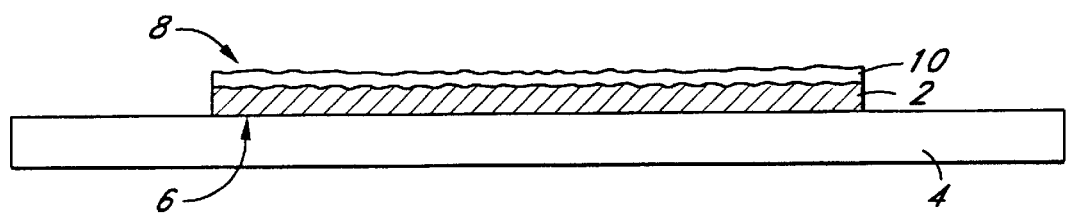
FIGS. 1A–F illustrate a conventional process for forming a substrate.
Figure 1B:
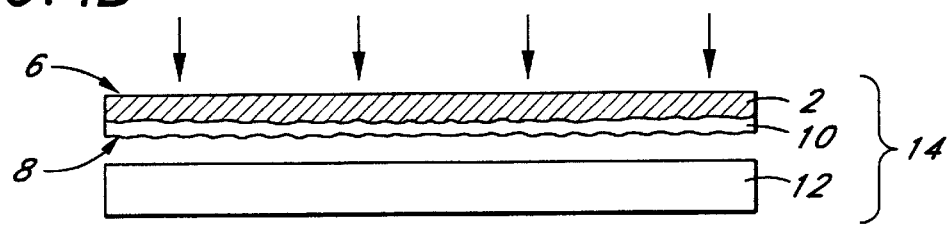
Figure 1C:
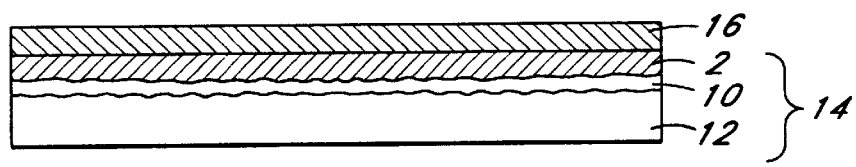
Figure 1D:
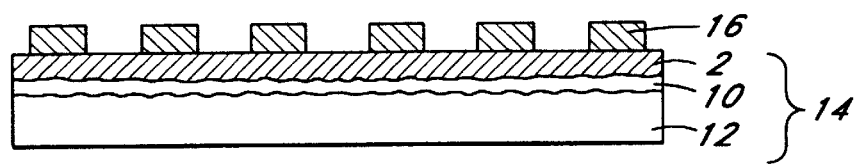
Figure 1E:
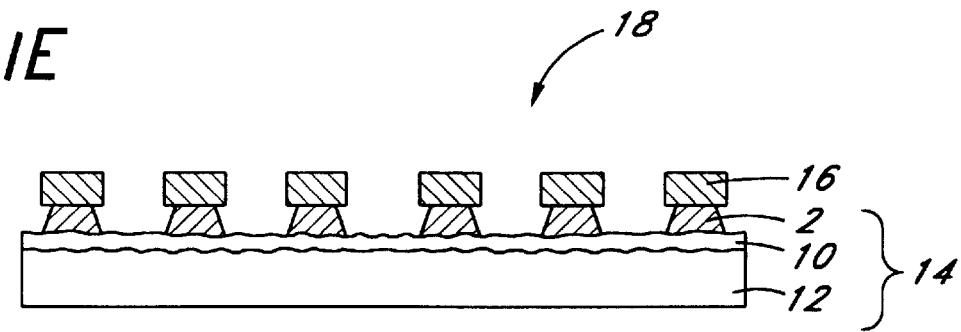
Figure 1F:
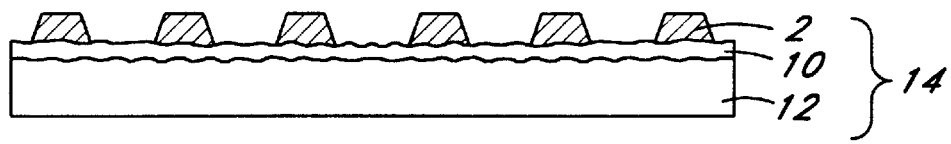

The release film 104a and/or 104b serves two functions: 1) it provides the base laminate 102 with a very smooth surface after lamination, and 2) it provides a protective cover for the base laminate 102 until just prior to use in the circuit board fabrication line. In one embodiment, the surface roughness $\mu$ of the base laminate 102 of the present invention is no greater than 6.0 microns (peak-to-valley, $R_Z$DIN), as measured with a contact profilometer. In a further embodiment, the surface roughness $\mu$ of the base laminate 102 is 0 microns $\leq \mu \leq 3$ microns (peak-to-valley, $R_Z$DIN), as measured with a contact profilometer. It should be noted that the use of other types of surface roughness measurement techniques (e.g., a laser profilometer) will yield surface roughness ranges that vary compared to the contact profilometer data. Such variations are due to the different surface roughness measurement techniques employed, but can be correlated to measurements provided by a contact profilometer. For example, as discussed in an earlier section, the surface roughness $\mu$ of surface 8 (FIGS. 1A and 1B) of a conventional substrate is typically greater than 6.0 microns (peak-to-valley, $R_Z$DIN), as measured with a contact profilometer. The surface roughness $\mu$ of the base laminate 102 of the present invention is no greater than 6.0 microns (peak-to-valley, $R_Z$DIN), as measured with a contact profilometer. It is understood that other types of surface roughness measurement techniques, while providing surface roughness measurements that vary compared to that measured by a contact profilometer, will still yield surface roughness measurements correlated to that provided by the contact profilometer.

It has been determined that the use of polyimide or polypropylene as the removable layer 104a and/or 104b provides two optimal features in the base laminate 102: very smooth high gloss surfaces with no or minimal adhesion of the release film 104a and/or 104b to the base laminate layer $102_1-102_n$. It has also been determined that samples produced with polar polymers such as nylon, polyethylene naphthalate (PEN), and polyetheylene terephthalate (PET) have adhered to the finished laminate and could not be removed from the substrate.

Figure 5B:
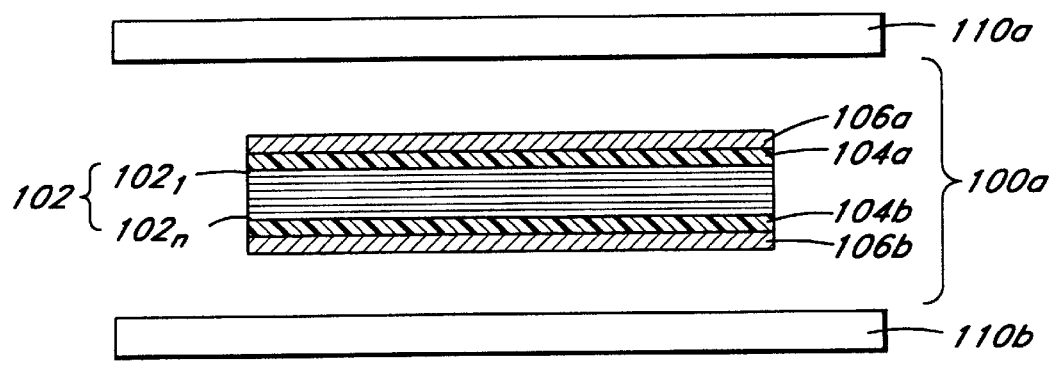
FIG. 5B illustrates a side view of a second embodiment of a polymer-coated base laminate 100a provided in accordance with the principles of the present invention.

The release film 104a and/or 104b may be removed from the outer surfaces of the base laminate 102 prior to drilling. In one embodiment, when using a polymer release film such as thermoplastic release sheets that melt at the press temperature, sacrificial sheets 106a and/or 106b such as copper foils or non-polar polymer films may be placed between the polymer release film (e.g., 104a and/or 104b) and the press plates 110a and 110b, as shown in FIG. 5B. The use of the sacrificial sheets 106a and/or 106b such as electrodeposited copper, rolled copper or aluminum, or a polymer film that does not melt at press temperature, prevents the polymer release film (e.g., 104a and/or 104b) from adhering to the press plates 110a and 110b during lamination. The sacrificial sheets 106a and/or 106b and the polymer release film (e.g., 104a and/or 104b) may be subsequently peeled off the base laminate 102 to provide a base laminate 102 with a smooth topography.

Figure 5C:
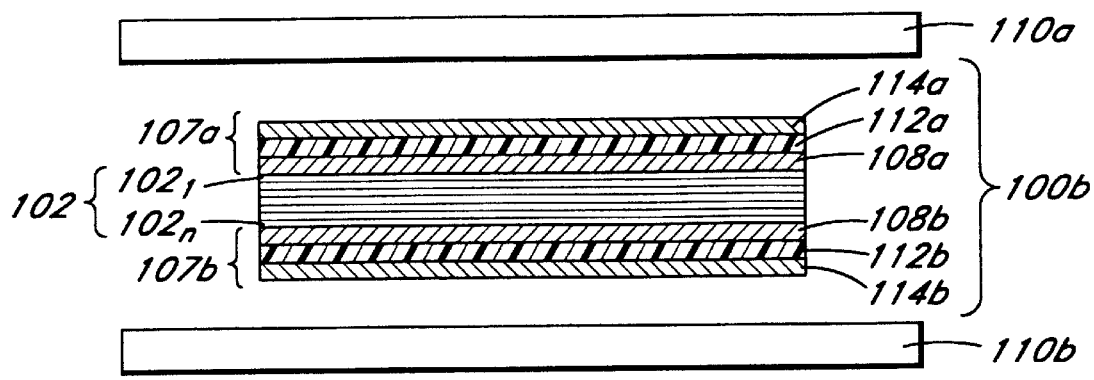
FIG. 5C illustrates a side view of one embodiment of a resin-coated base laminate 100b provided in accordance with the principles of the present invention.

FIG. 5C illustrates a third embodiment of a polymer-coated base laminate 100b provided in accordance with the principles of the invention. The polymer-coated base laminate 100b comprises a base laminate 102 onto which a conductive layer 107a and/or 107b such as a coated copper foil, is laminated. The conductive layer 107a and/or 107b comprises a copper layer 114a and/or 114b, coated with a fully cured (or c-staged) layer of resin 112a and/or 112b, onto which an adhesive layer of resin 108a and/or 108b is coated. The adhesive layer of resin 108a and/or 108b is attached to the base laminate 102 during the lamination process. One example of the conductive layer 107a and/or 107b includes a double-pass resin layer such as that marketed by AlliedSignal Inc. under the tradename RCC™. During lamination, the adhesive layer 108a and/or 108b softens, flows and cures, forming a fully cured laminate 100b with a smooth surface.

Figure 5D:
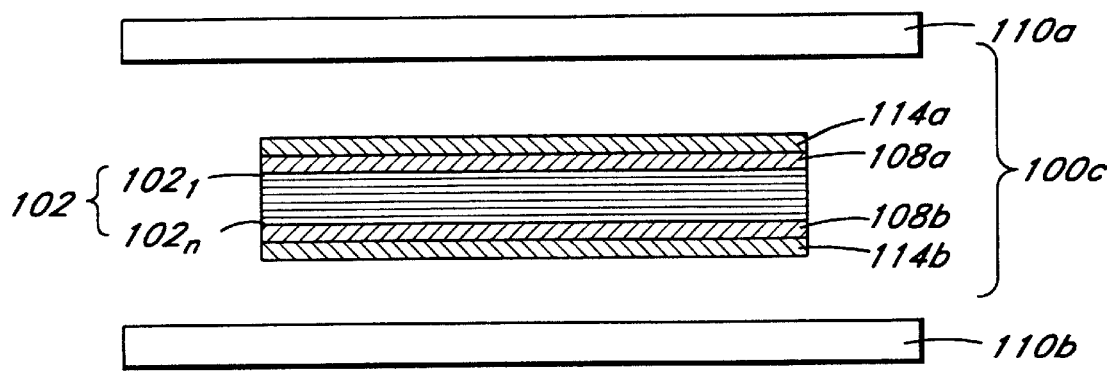
FIG. 5D illustrates a side view of a second embodiment of a resin-coated laminate 100c provided in accordance with the principles of the present invention.

In another embodiment, as shown in FIG. 5D, the layer of resin 112a and/or 112b as shown in FIG. 5C is not used. Instead, only a single layer of adhesive 108a and/or 108b attached between the base laminate 102 and the copper layer 114a and/or 114b. One example of such an adhesive is a single-pass resin layer such as that provided by Mitsui under the tradename Multifoil™. During lamination, the adhesive layer 108a and/or 108b softens, flows and cures forming a fully cured laminate 100c with a smooth surface. After lamination, the copper layer 114a and/or 114b can either be etched to the desired thickness (typically 5–9 microns), or completely removed. The resulting surface will have the surface roughness of the copper layer 114a and/or 114b. To obtain a smooth surface, a copper layer 114a and/or 114b with a very low profile tooth structure may be used.

Figure 6:
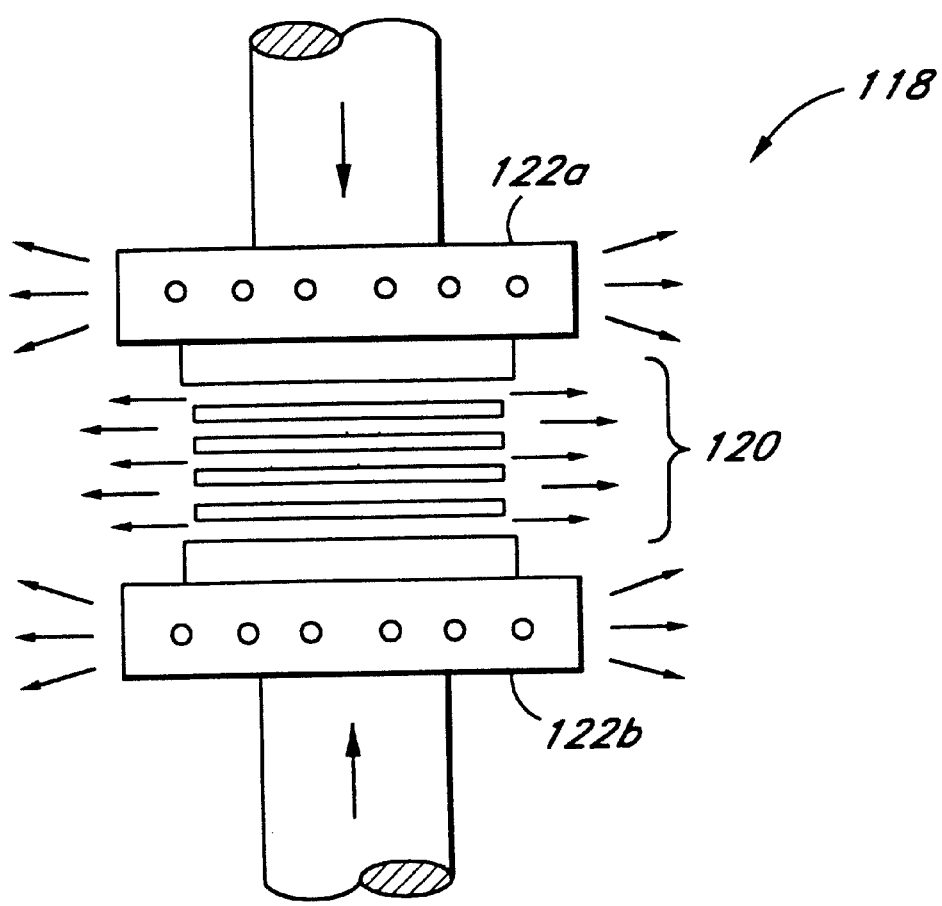
FIG. 6 is a side view of one embodiment of a hydraulic press 118 for laminating a book 120 of polymer-coated base laminates or resin-coated base laminates.

FIG. 6 is a side view of one embodiment of a hydraulic press 118 for laminating a book 120 of polymer-coated base laminates 100 or 100a or resin-coated base laminate 100b or 100c. Although this embodiment for laminating the polymer-coated base laminate 100 or 100a or resin-coated base laminate 100b or 100c is described, it is understood that other lamination processes generally known in the art, may be used. Such alternate lamination processes include: a continuous roll lamination process and an autoclave lamination process. As shown, each book 120 comprises a plurality of alternating layers of a polymer-coated base laminate 100 or 100a or a resin-coated base laminate 100b or 100c, and a press plate 110, with a press plate 110 located at either end of the book 120. The book 120 is stacked between two platens 122a and 122b.

The press cycle for the polymer-coated base laminate 100 or 100a is dependent on the type of release film 104a and 104b used. For polymer release films (104a and/or 104b) that do not melt, but only softens at a press temperature in range of between 350° F. and 375° F., or for conductive metal release films (e.g., 104a and/or 104b), the book 120 may be loaded hot at 180° F. into the press 118 at a pressure of 400 psi. Vacuum (up to 29 inches of mercury), is applied to the book 120 using either a vacuum enclosed press or by placing each laminate 100 or 100a in a sealable bag or by using vacuum frames, and drawing vacuum on the individual laminate 100 or 100a during the press cycle. The sample is then ramped at 10° F. per minute to 375° F. and allowed to dwell at this temperature for 75 minutes. The sample is then cooled to 100° F. for 20 minutes. A post bake process may be implemented after lamination to additionally reduce stress in the laminate 100. In one embodiment, the post bake process occurs at a temperature in a range of between 350° F. and 375° F. for a period in the range of 1–4 hours. However, the post bake process may occur at lower temperatures for a longer time period or at a higher temperature for a shorter time period.

For polymer release films (e.g., 104a and 104b) that melt at a press temperature in range of between 350° F. and 375° F., a modified press cycle may be implemented to minimize slipping of the resulting base laminate 102 during lamination. For these materials, two different press cycles may be used. In each case, the samples are loaded at 180° F., the pressure is increased to 400 psi, vacuum (up to 29 inches of mercury), is applied to the book 120 using either a vacuum enclosed press or placing each laminate 100 or 100a in a sealable bag or by using vacuum frames, and drawing vacuum on the individual laminate 100 or 100a during the press cycle. The temperature is then increased at 10° F./min. to 330° F., and the samples are held at 330° F. for 75 minutes. From this point, two different options may be used: (1) cool the laminate 100 or 100a to 100° F. for 20 minutes, then implement a post bake process (in the post bake press or in an oven) of 1–4 hours at 375° F. (the post bake process may occur at lower temperatures for a longer time period or at a higher temperature for a shorter time period; or (2) decrease the pressure to 50 psi, increasing the temperature at 10° F./minute to 375° F., then maintaining this temperature for 75 minutes; then, the laminate 100 or 100a is then cooled to 100° F. for 20 minutes. A post bake process may be added to the second option to additionally relieve stress. In one embodiment, the post bake process occurs at a temperature in a range of between 350° F. and 375° F. for a period in the range of 1–4 hours. However, the post bake process may occur at lower temperatures for a longer time period or at a higher temperature for a shorter time period.

The press cycle for the resin-coated laminate 100b or 100c starts with loading the book 120 at 200° F. and applying a pressure of 25 psi. Vacuum is applied to the book 120 using either a vacuum enclosed press or placing each laminate 100b in a sealable bag or by using vacuum frames, and drawing vacuum on the individual laminate 100b during the press cycle. The pressure of 225 psi is maintained during the entire press cycle. The sample is then ramped 5–15° F. per minute to 350–390° F. and allowed to dwell at this temperature for 45–90 minutes. The sample is then cooled to 100° F. for 20 minutes and the pressure is removed.

Figure 7:
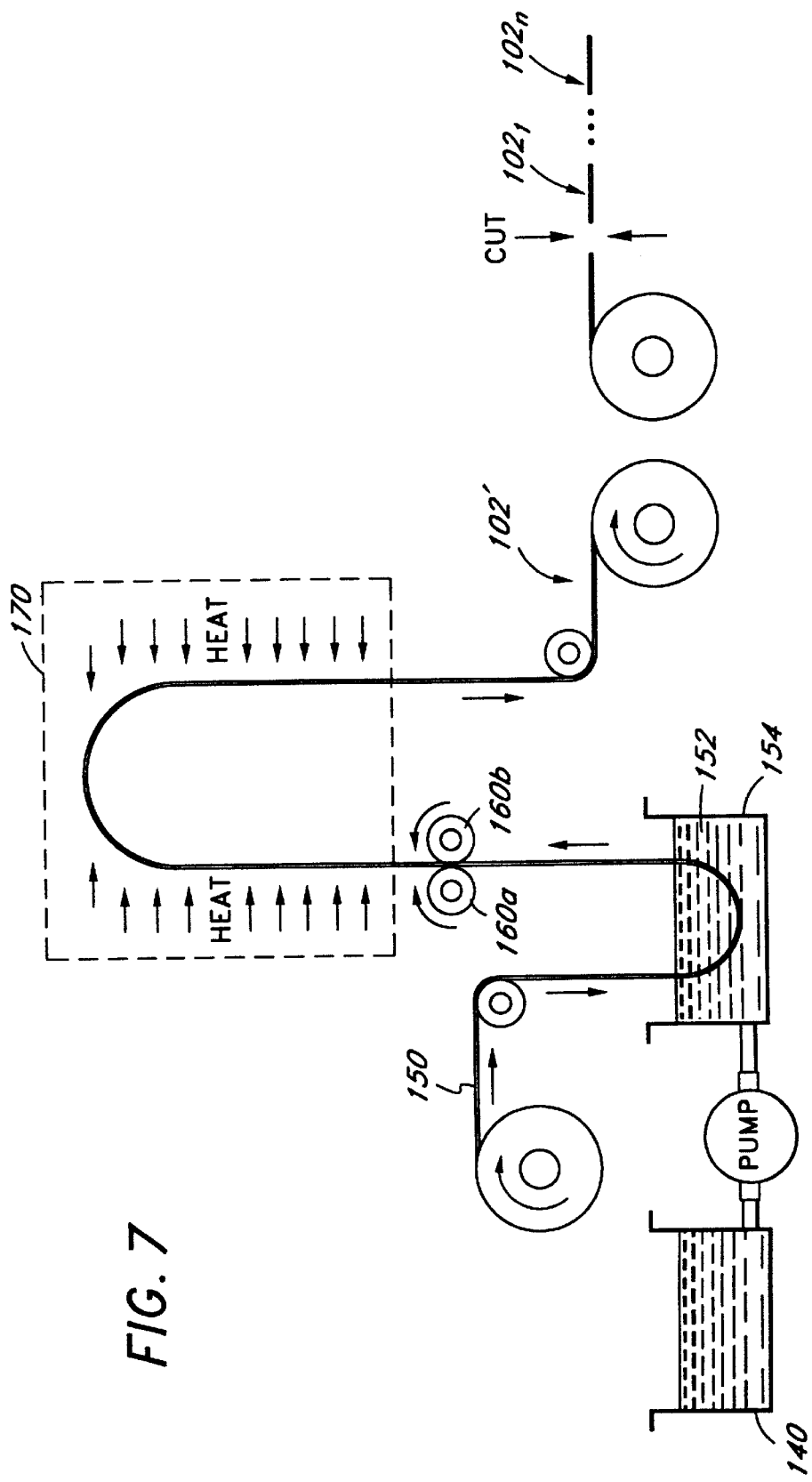
FIG. 7 illustrates one embodiment of a process for fabricating the base laminate 102 in accordance with the principles of the present invention.

FIG. 7 illustrates one embodiment of a process for fabricating the base laminate 102 in accordance with the principles of the present invention. The base laminate 102 may be obtained by fabricating a plurality of base laminate layers $102_1$–$102_n$, or a single ply of the base laminate layer (e.g., $102_1$) with a low cigar void (cylindrical voids in the interstices of the fiber bundles, such as air or solvent trapped in the fiber bundles) and a low laminate void count. This may be accomplished by selecting an appropriate cloth, and providing good or strong and consistent resin penetration of the cloth, so as to obtain a laminate with a very consistent resin content and low void content. It has also been determined that the use of an appropriate curing agent, which provides a resin that exhibits low moisture absorption, will provide a laminate structure with a low dielectric constant and a low dissipation factor. The cloth and resin are also selected to provide a base laminate 102 that has a controlled coefficient of thermal expansion (CTE) that is closely matched to the CTE of the seed layer (e.g., the second conductive layer 56 or 84).

Thus, to provide each base laminate layer $102_1, \ldots, 102_n$, a balanced cloth (i.e., a cloth having a uniform weave) is impregnated with a resin having a glass transition temperature (Tg) of greater than 180° C., a dielectric constant in the range of 2.9–3.1, and which is cured to provide base laminate layer $102_1, \ldots, 102_n$. The resulting base laminate layer $102_1, \ldots,$ or $102_n$ is stress relieved; has a reduced dissipation factor in the range of 0.008–0.015; a low moisture content in the range of 0.4–0.6% by weight; and a low dielectric constant in the range of 3.2–3.7. The resulting base laminate layer $102_1, \ldots,$ or $102_n$ also has a controlled CTE that is closely matched to the CTE of the second conductive layer 56 or 82 (e.g., a copper seeding layer) that is subsequently attached to the base laminate 102.

In particular, to provide the smooth substrate 50 or 80 or 102 of the present invention, a cloth 150 is first selected. In one embodiment, the cloth 150 has a balanced weave construction that provides isotropic properties in the plane of the weave. Such a balanced weave construction includes the use of yarn bundles that are very uniform in both the warp and fill (X and Y) directions, i.e., in the plane of the weave. Examples of such a balanced cloth include a glass cloth and a non-glass cloth. In one embodiment, the balanced weave glass cloth has between 50–70 ends/inch. In one further embodiment, the balanced weave glass cloth has 60 ends/inch in both the warp and fill directions. Typical fine weave class cloth styles include the D and E type filaments. In one embodiment of the present invention, the warp and fill yarns are of the DE type (filament diameter of 0.00025 inches). In a typical glass cloth, the warp and fill yarns may or may not be of the same yarn type (i.e., the warp and fill yarns may be made using different bushings during the yarn spinning process). In one embodiment of the present invention, the DE yarns are produced on the same manufacturing bushing and identical yarns are used in both the warp and the fill directions. This provides a very uniform and consistent fabric (i.e., one with identical cross-sectional area) in both the warp and fill directions.

Alternatively, a Kevlar™ woven cloth or a quartz fiber cloth may be used. Other types of balanced woven cloth generally known in the art may also be used. The warp and fill yarns have different geometrics: the warp yarns have a tendency to be more cylindrical and have a more circular cross section, while the fill yarns have a more elliptical cross section. It has been found that a prepreg material made with a yarn with a more cylindrical cross section has a tendency to have more cigar voids and laminate voids. Accordingly, the use of a fabric that has yarn bundles that are very uniform in both the warp and fill directions and have a more elliptical cross section would provide the desired consistency for fabricating the laminate 50 or 80 or 102 of the present invention.

It has also been determined that a cloth 150 with a uniform cross-sectional area in the warp and fill directions, would facilitate more consistent drilling when a via opening is to be provided in the substrate 26 or 26a. If the yarn knuckles are too thick or if they occupy a large area, the drill bit has a higher propensity to deflect off the knuckles, resulting in a non-uniform hole. In addition, laser drilling of a smaller weave would result in a higher drilling rate and more uniform hole walls.

In addition, the cloth 150 that is selected also has a controlled coefficiency thermal expansion (CTE) that is closely matched to that of the second conductive layer (e.g., the copper layer) 56 (of FIG. 3C) or 84 (of FIG. 4C). The CTE for copper is 17 parts per million (ppm). In one embodiment, the CTE of the cloth 150 is in the range of 15–20 ppm. By providing a base laminate 102 that is made from a cloth 150 having a controlled CTE that is closely matched to that of the second conductive layer (e.g., the copper layer) 56 (of FIG. 3C) or 84 (of FIG. 4C), and by using the removable release film 104a and/or 104b during the manufacture of the base laminate 50, 80 or 102 (thus avoiding the need to use the conventional techniques for providing circuit substrates, which includes lamination of electrodeposited copper foils to thermosetting resin-cloth prepregs under heat and pressure), the resulting circuit substrate 26 or 26a is stress-relieved. In addition, post baking of the laminate 100 or 100a may also be implemented to provide additional stress relief.

In one embodiment, the cloth 150 may be constructed from a material that is laser ablatable, so as to facilitate subsequent laser drilling of via openings in the laminate 50, 80 or 102. Such a cloth 150 may be constructed from: (1) an ultra-violet (UV)-absorbable fiber, (2) by coating the cloth 150 with a UV absorbable substance, (3) by coating the cloth 150 with an enhanced thermal conductivity substance, or (4) by using a non-woven glass in which (i) the diameter of the fiber is smaller than the hole to be lased or (ii) the filler material has a small diameter.

Upon selection of the appropriate cloth 150, a coupling agent is applied to the cloth 150 to minimize measling and blistering of the laminate 50, 80 or 102 after exposure to high temperature and humidity. Selection of the appropriate coupling agent is required to minimize the potential for Conductive Anodic Filament (CAF) formation. In the absence of a tenacious bond between the resin and the cloth, while under the application of humidity and bias, copper filament growth can occur along the fiber bundles. The choice of the optimal coupling agent is key to providing a high level of CAF resistance. Low propensity for CAF formation is a key functional parameter for substrates used in packaging applications. In one embodiment, the coupling agent CS309 as marketed by Clark Schwebel Inc. was found to provide the optimum results during temperature and humidity exposure (e.g., during the pressure cooker test).

Upon selection and conditioning of the cloth 150, the cloth 150 is impregnated with a resin solution 152. The term "impregnation" as used herein includes solution casting, extrusion or spinning of the resin solution 152 into the cloth 150. As shown in FIG. 7, one embodiment of the process for attaching the resin solution 152 to the cloth 150 is to pass the cloth 150 through a resin bath 154 containing a selected resin solution 152. In one embodiment, the resin solution 152 comprises a resin, a solvent which lowers the viscosity of the resin for better penetration of the cloth, a catalyst and additives, all of which may be premixed in a container 140 and subsequently pumped into the resin bath 154. In one embodiment, the resin solution 152 includes a resin having a high glass transition temperature (Tg) resin. In one embodiment, Tg>180° C. An example of the resin used in the resin solution 154 includes an epoxy resin. It is understood that any other resin with the properties described herein (i.e., a high Tg, a low dielectric constant, and appropriately cured to provide a base laminate with a low moisture content) may be used.

In one further embodiment, the resin solution 152 is cured with an agent that does not contain dicyandiamide (DICY). The use of a non-DICY curing agent leads to a cured resin that exhibits significantly lower moisture absorption compared with standard epoxy resins. Such low moisture absorption is a key feature of the substrate 26 or 26a for providing a base laminate 102 with enhanced performance during accelerated moisture testing. Such a non-DICY curing agent provides a laminate structure with a low moisture content, a reduced dielectric constant and a reduced dissipation factor, as compared with a standard FR4 epoxy-based laminate. In one embodiment, the cured resin has a dielectric constant in the range of 2.9–3.1.

During impregnation of the cloth 150, the appropriate resin solution 152 easily wets the bundles of the cloth 150, and exhibits excellent penetration into the fiber bundles. Such good resin penetration during impregnation results in a base laminate layer $102_1, 102_2, \ldots,$ or $102_n$ with very low levels of cigar voids, which subsequently results in a base laminate 102 with very low void content. In addition, consistent impregnation of the cloth 150 by the resin solution 152 results in the added benefit of providing a laminate 102 with a very consistent resin content. The dielectric constant of the resulting laminate 102 depends on the ratio of the resin-to-fiber, and a laminate with a very consistent resin content will exhibit a stable dielectric constant in the plane of the laminate. This stability is important for signal speed integrity across the circuit. For example, to yield a very uniform 0.002 inch laminate 102, the base laminate 102 consists of a single ply of glass cloth having 58–59% of resin by weight. In one embodiment, for enhanced surface smoothness (at a slight increase in thickness), the resin content of the base laminate layer $102_1, 102_2, \ldots, 102_n$ may be increased to the range of 60–64% of resin by weight. During the impregnation process, care is taken to control resin content very closely. This is accomplished by pulling the cloth 150 through two counter rotating metering rolls 160a and 160b (FIG. 7).

The resin-impregnated cloth 150 is then dried in a drying tower 170 for a duration of 2 to 3 minutes at approximately 350° C. The heat in the drying tower 170 removes the solvent in the resin solution 152. The cloth 150 is then subjected to a further period of heating at approximately 350° C. and for a duration of 1 to 3 minutes, to partially cure the resin impregnated within the cloth 150. The resulting base laminate layer (or prepreg material) 102' may then be cut to the required size to provide each ply or each base laminate layer $102_1 \ldots 102_n$ of base laminate 102 (FIGS. 5A–5D).

The present invention thus provides an apparatus and method of providing a smooth substrate having reduced conductive defects. The substrate has improved dimensional consistency, enabling fine line formation, and decreased pad size. As a result, a high density printed circuit board with reduced conductive defects may be provided.

The present invention may be embodied in other specific forms without departing from its spirit or essential characteristics. The described embodiments are to be considered in all respects only as illustrative and not restrictive. The scope of the invention is, therefore, indicated by the appended claims rather than the foregoing description. All changes which come within the meaning and range of equivalency of the claims are to be embraced within their scope.

What is claimed is:

1. An electrical substrate comprising:
   a dielectric layer having a surface roughness of no greater than 6.0 microns; and
   a first conductive layer attached to said dielectric layer wherein the conductive layer is applied to at least a portion of the dielectric layer surface that has a roughness of no greater than 6.0 microns.

2. The substrate of claim 1, wherein the surface roughness of said dielectric layer is in a range between 0 microns and 3 microns.

3. The substrate of claim 1, wherein said first conductive layer is a seed layer.

4. The substrate of claim 1, further comprising:
   a second conductive layer that is attached to said first conductive layer.

5. The substrate of claim 4, wherein said first conductive layer is an adhesion layer.

6. The substrate of claim 5, wherein said second conductive layer is a seed layer.

7. The substrate of claim 4, further comprising a layer of resist that is attached to said second conductive layer.

8. The substrate of claim 4, further comprising a via that extends through the dielectric layer.

9. The substrate of claim 1, wherein said dielectric layer comprises:
   a cloth having a uniform weave; and
   a resin that is consistently impregnated within the uniform weave of said cloth.

10. The substrate of claim 9, wherein said cloth comprising a plurality glass fibers that provide said uniform weave wherein a cross section of each of said glass fibers is elliptical.

11. The substrate of claim 9, wherein said resin has a glass transition temperature of greater than 180° C.

12. The substrate of claim 9, wherein said resin has a dielectric constant in the range of 2.9–3.1.

13. The substrate of claim 9, wherein said resin is cured with an agent that does not contain dicyandiamide (DICY).

14. The substrate of claim 1, wherein said dielectric layer has a coefficient of thermal expansion (CTE) that is closely matched with a CTE of said first conductive layer.

15. The substrate of claim 1, wherein said dielectric layer has a CTE that is closely matched to a CTE of said first conductive layer; a dielectric constant in the range of 3.2–3.7; a moisture content in the range of 0.4–0.6% by weight; and a dissipation factor in the range of 0.008–0.015.

16. The substrate of claim 1, wherein said substrate further comprises a removable layer that is attached to said dielectric layer, said removable layer being removed prior to attachment of said first conductive layer to said dielectric layer.

17. An integrated circuit package, comprising:
   a substrate comprising:
   a dielectric layer having a surface roughness no more than 6.0 microns; and
   a first conductive layer attached to said dielectric layer; and an integrated circuit that is attached to said substrate wherein the conductive layer is applied to at least a portion of the dielectric layer surface that has a roughness of no greater than 6.0 microns.

18. The package of claim 17, wherein the surface roughness of said dielectric layer is in a range between 0 microns and 3 microns.

19. The package of claim 17, wherein said integrated circuit is attached to said substrate by solder.

* * * * *